(12) United States Patent
Becker et al.

(10) Patent No.: US 9,786,627 B2
(45) Date of Patent: Oct. 10, 2017

(54) METHOD FOR CREATING A CONNECTION BETWEEN METALLIC MOULDED BODIES AND A POWER SEMICONDUCTOR WHICH IS USED TO BOND TO THICK WIRES OR STRIPS

(75) Inventors: Martin Becker, Kiel (DE); Ronald Eisele, Surendorf (DE); Frank Osterwald, Kiel (DE); Jacek Rudzki, Kiel (DE)

(73) Assignee: Danfoss Silicon Power GmbH, Flensburg (DE)

( * ) Notice: Subject to any disclaimer, the term of this patent is extended or adjusted under 35 U.S.C. 154(b) by 206 days.

(21) Appl. No.: 14/348,356

(22) PCT Filed: Sep. 10, 2012

(86) PCT No.: PCT/EP2012/003786
§ 371 (c)(1),
(2), (4) Date: Mar. 28, 2014

(87) PCT Pub. No.: WO2013/053419
PCT Pub. Date: Apr. 18, 2013

(65) Prior Publication Data
US 2014/0230989 A1    Aug. 21, 2014

(30) Foreign Application Priority Data
Oct. 15, 2011   (DE) .................. 10 2011 115 886

(51) Int. Cl.
*H01L 21/00* (2006.01)
*H01L 23/00* (2006.01)
*H01L 21/683* (2006.01)

(52) U.S. Cl.
CPC .......... *H01L 24/80* (2013.01); *H01L 21/6835* (2013.01); *H01L 24/03* (2013.01);
(Continued)

(58) Field of Classification Search
CPC .................. Y10T 156/10; H01L 24/80; H01L 2221/68322; H01L 2221/68363;
(Continued)

(56) References Cited

U.S. PATENT DOCUMENTS 5,148,265 A * 9/1992 Khandros ........... H01L 21/6836
257/668
5,300,458 A   4/1994 Kuhnert et al.
(Continued)

FOREIGN PATENT DOCUMENTS

CN    101339934 A    1/2009
DE    19612838 A1    5/1997
(Continued)

OTHER PUBLICATIONS

Danish Office Action for Application Serial No. 102011115887.5 dated Nov. 25, 2011.
(Continued)

*Primary Examiner* — Carson Gross
(74) *Attorney, Agent, or Firm* — McCormick, Paulding & Huber LLP

(57) ABSTRACT

The invention relates to a method for connecting a power semi-conductor chip having upper-sided potential surfaces to thick wires or strips, consisting of the following steps: Providing a metal molded body corresponding to the shape of the upper-sided potential surfaces, applying a connecting layer to the upper-sided potential surfaces or to the metal molded bodies, and applying the metal molded bodies and adding a material fit, electrically conductive compound to the potential surfaces prior to the joining of the thick wire bonds to the non-added upper side of the molded body.

22 Claims, 1 Drawing Sheet

(52) U.S. Cl.
CPC .............. *H01L 24/05* (2013.01); *H01L 24/45* (2013.01); *H01L 2221/68322* (2013.01); *H01L 2221/68363* (2013.01); *H01L 2221/68372* (2013.01); *H01L 2224/03003* (2013.01); *H01L 2224/0311* (2013.01); *H01L 2224/03013* (2013.01); *H01L 2224/03438* (2013.01); *H01L 2224/03505* (2013.01); *H01L 2224/04042* (2013.01); *H01L 2224/0603* (2013.01); *H01L 2224/29111* (2013.01); *H01L 2224/29144* (2013.01); *H01L 2224/29339* (2013.01); *H01L 2224/29399* (2013.01); *H01L 2224/45014* (2013.01); *H01L 2224/45015* (2013.01); *H01L 2224/45124* (2013.01); *H01L 2224/45147* (2013.01); *H01L 2224/48491* (2013.01); *H01L 2224/8382* (2013.01); *H01L 2224/8384* (2013.01); *H01L 2224/83801* (2013.01); *H01L 2224/94* (2013.01); *H01L 2924/01013* (2013.01); *H01L 2924/01014* (2013.01); *H01L 2924/01028* (2013.01); *H01L 2924/01029* (2013.01); *H01L 2924/01047* (2013.01); *H01L 2924/1033* (2013.01); *H01L 2924/1203* (2013.01); *H01L 2924/12042* (2013.01); *H01L 2924/1304* (2013.01); *H01L 2924/35* (2013.01); *H01L 2924/351* (2013.01); *Y10T 156/10* (2015.01)

(58) Field of Classification Search
CPC ........... H01L 2224/03003; H01L 21/78; H01L 24/02–24/09; H01L 24/18–24/25
See application file for complete search history.

(56) References Cited

U.S. PATENT DOCUMENTS

| | | | |
|---|---|---|---|
| 5,414,299 A | 5/1995 | Wang et al. | |
| 5,510,650 A | 4/1996 | Erskine, Jr. | |
| 5,892,271 A | 4/1999 | Takeda et al. | |
| 5,986,338 A | 11/1999 | Nakajima | |
| 6,054,337 A * | 4/2000 | Solberg | H01L 25/0657 257/E21.705 |
| 6,055,148 A | 4/2000 | Grover | |
| 6,100,112 A | 8/2000 | Amano et al. | |
| 6,137,159 A | 10/2000 | Tsubosaki et al. | |
| 7,498,671 B2 | 3/2009 | Fujiwara et al. | |
| 2002/0036055 A1* | 3/2002 | Yoshimura | H01L 21/6835 156/234 |
| 2003/0162382 A1 | 8/2003 | Aono et al. | |
| 2005/0276934 A1 | 12/2005 | Fukui et al. | |
| 2007/0018338 A1 | 1/2007 | Hosseini et al. | |
| 2007/0246833 A1 | 10/2007 | Soga et al. | |
| 2007/0278550 A1* | 12/2007 | Asai | H01L 21/6835 257/306 |
| 2007/0284722 A1 | 12/2007 | Standing | |
| 2008/0246130 A1 | 10/2008 | Carney et al. | |
| 2009/0008775 A1 | 1/2009 | Tanaka et al. | |
| 2010/0207263 A1 | 8/2010 | Nikitin et al. | |
| 2011/0075451 A1* | 3/2011 | Bayerer | H01L 24/06 363/37 |
| 2011/0079792 A1 | 4/2011 | Lostetter et al. | |
| 2014/0225247 A1 | 8/2014 | Becker et al. | |

FOREIGN PATENT DOCUMENTS

| | | |
|---|---|---|
| DE | 102004036905 A1 | 3/2006 |
| DE | 102005047566 A1 | 4/2007 |
| DE | 10 2007 025 950 A1 | 1/2008 |
| DE | 102005054872 B4 | 4/2012 |
| EP | 0 520 294 A1 | 12/1992 |
| EP | 1 772 900 A2 | 4/2007 |
| JP | 56-101752 A | 8/1981 |
| JP | 2003229527 A | 8/2003 |
| JP | 2008-16818 A | 1/2008 |
| WO | 2006012847 A1 | 2/2006 |

OTHER PUBLICATIONS

Danish Office Action for Application Serial No. 102011115887.5 dated Dec. 11, 2013.
International Search Report for PCT Application PCT/EP2012/003787 dated Dec. 20, 2012.
International Search Report for PCT Serial No. PCT/EP2012/003786 dated Dec. 21, 2012.

* cited by examiner

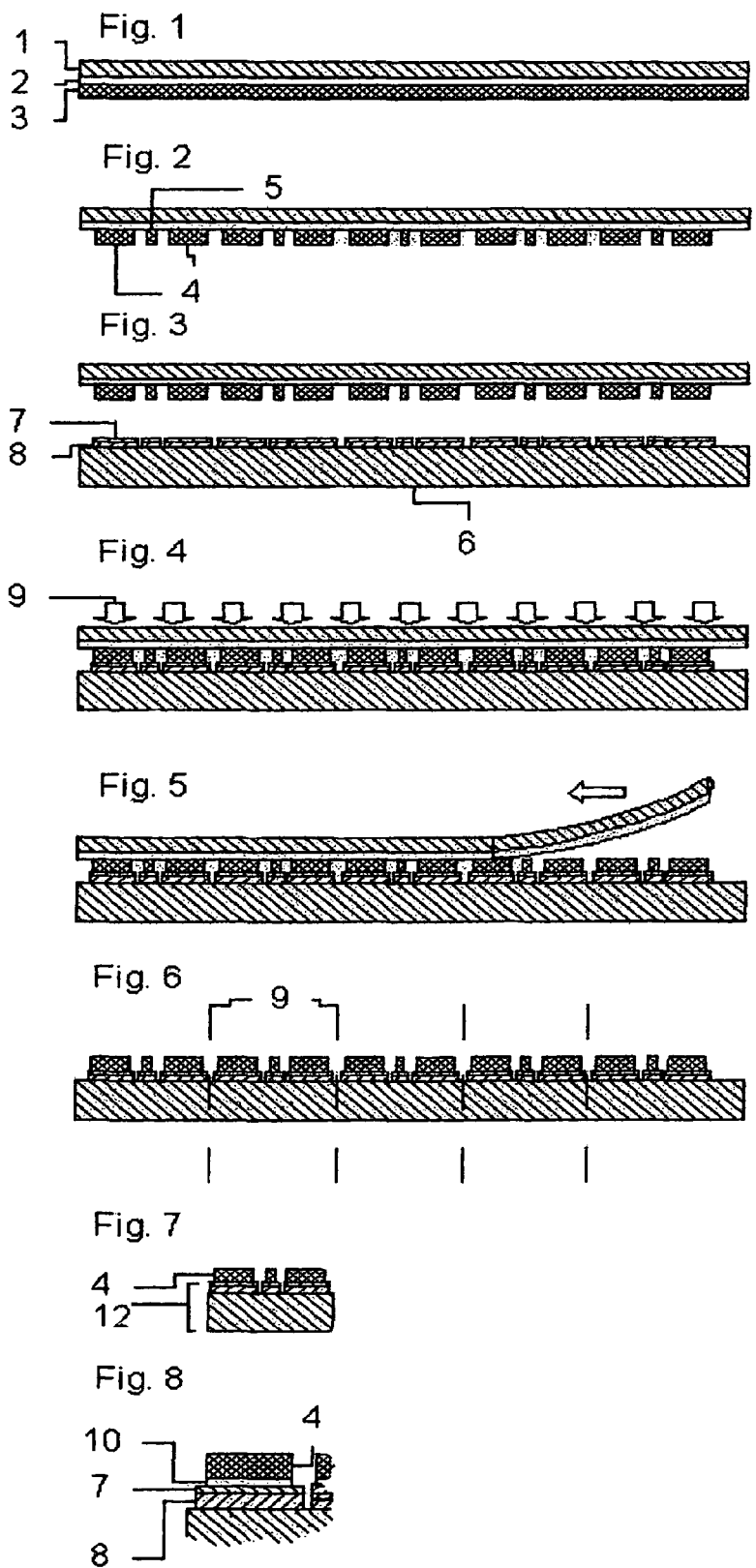

US 9,786,627 B2

METHOD FOR CREATING A CONNECTION BETWEEN METALLIC MOULDED BODIES AND A POWER SEMICONDUCTOR WHICH IS USED TO BOND TO THICK WIRES OR STRIPS

CROSS REFERENCE TO RELATED APPLICATIONS

This application is entitled to the benefit of and incorporates by reference subject matter disclosed in International Patent Application No. PCT/EP2012/003786 filed on Sep. 10, 2012 and German Patent Application No. 10 2011 115 886.7 filed Oct. 15, 2011.

FIELD OF THE INVENTION

The invention concerns a method of connecting a power semiconductor chip with upper side potential faces to thick wires and strips.

BACKGROUND

In order to develop long-lived and robust power conductor modules, especially the upper and lower connections of the semiconductor (upper side and lower side) have high thermal and electrical requirements. Usually, the lower side of the semiconductor is connected by a soldered connection or partly also by a sintered or diffusion soldered connection.

Normally, the upper side of the semiconductor comprises a metallisation or a metal layer that is optimised for the bonding process of thick aluminium wires. In spite of such highly deformable metallisation layers on the upper and lower side of the semiconductor, the semiconductors continue to become thinner in order to reduce the electrical losses. Currently, power semiconductors on the market have a total thickness of 70 µm. Research institutes have already presented the first wafers with the extreme thickness of only 10 µm.

The upper side chip connection has a vary large influence on the limitation of the life duration of a power module. A very robust sintered connection on the lower side of a chip only causes a slight increase in the module life duration, as the failure of the aluminium wires on the upper side of the semiconductor is the limiting factor.

For many years, the Al-bonding has been an established technology in the production lines for power electronics. A continuous optimisation of the bonding processes has caused an increase in the expected life duration of this connection. However, this high level is approximately at the physical limit of the stressability of an aluminium weld connection, so that large steps in the life duration expectation can only be realised by new concepts in the design and bonding technique. This requirement is also supported by the fact that already now the sintering technology (compared with the soldering technology) on the lower side of the semiconductor contributes to a two-figure increase in the factor of the life duration expectation.

Further, during the process difficulties occur in the handling of the 70 µm thin semiconductors (and those difficulties are expected to increase heavily with even thinner semiconductors!) Thus, both for the parameterisation of the production and test processes and for the configuration of the concepts, the very thin silicon layer is an increasing profit risk in the production. The risk of fracture exists not only due to thermo mechanical stress, but also due to light loads during the production processes (for example mounting of the contact needle for high current tests at wafer level).

SUMMARY

It is now the object of the invention to improve the life duration of a power module, in particular of the power semiconductor chip, by improving the contacts on the upper side potential face(s). At the same time, the profit is to be increased by a design which is more stable and involves less risk of fracture.

According to the invention, this is solved by the features of the main claim. The sub claims refer to advantageous embodiments. In order to realise the change to this new technology for the upper side connection, required modifications will initially be described for the design of the power module.

These modifications enable the change of the upper side contacting to the thick-wire copper bonding technology, which provides a drastic increase in the load cycle endurance. Further, the modifications also provide a reduction of the risk of fractures caused by the thermo mechanical stresses of the semiconductors and the mechanical stresses from the production process.

This is caused by locating metallic layers or moulded bodies at least above and preferably also below the semiconductor so that the semiconductor is thermo mechanically stressed in a symmetric manner.

Further, the thin layers or moulded bodies form a mechanical protection of the surfaces, in particular across the potential faces, for example by frictional contacting test processes (high current tests at wafer level). This permits a safe electrical test of the semiconductor before completing the upper side connection of the semiconductor. For the electrical test, the surface of the metallic layer that is bonded to the semiconductor is contacted by special spring tools without risking damage to the fine surface structures of the semiconductor.

The invention concerns both a single power semiconductor chip, an arrangement of power semiconductors on a substrate, or a semiconductor wafer comprising a collection of semiconductor components. The individual chip (FIG. 7, detail 12), the arrangement and the complete wafer assembly (FIG. 3, detail 6) are provided on the upper side with a so-called moulded body 4; 5 of metal (preferably electrically and thermally well-conducting, like Cu, Ag, Au, Al, Mo, W and their alloys) that is approximately 30 µm to 300 µm thick. For thin semiconductors in the area of 30 µm, moulded bodies between 30 µm and 40 µm are used, and for thicker semiconductor chips of 150 µm to 200µ somewhat thicker moulded bodies between 100 µm and 150 µm are used.

This moulded body 4; 5 is fixed on the metallisation layer 8 of the semiconductor 12 by means of the low-temperature sintering technology (Ag-layer 7) (or diffusion soldering or gluing). The moulded body does not extend over the dimensions of the individual semiconductor 12, but may, in some embodiments, undercut parts of the upper side.

The required moulded bodies 4; 5 for the upper side contact faces 8 are made by patterning a metal foil 3, and they are carried by a carrying foil 1 with a bonding layer 2 (FIG. 1), in order to transfer them to the sinter-ready surface(s) of the individual power semiconductors, an arrangement of power semiconductors or the complete wafer assembly 6.

For this purpose, the required position and area of the upper side contacts are transferred to the structure of the metal foil. This is done, for example, by lithography and etching or by laser cutting (alternatively: milling) and removal of the offcuts (FIG. 2).

In a preferred embodiment, the moulded bodies 4; 5 can additionally be covered by an oxidation inhibiting layer (for example NiAu layer system FIG. 8, detail 10).

In this connection, the carrying foil serves to ensure mutual position accurate fixing of the moulded bodies in the bond.

The upper side contacts are now, as a bonding partner, covered within the borders of the contact faces by a bonding layer 7 of a sinterable silver (FIG. 3). The alternative placing of the sintering silver on the moulded body 4; 5 is also possible.

When the carrying foil with the fixed moulded bodies is placed on the power semiconductor(s), the bonding of the moulded bodies 4; 5 with the carrying foil 1 ensures that all predetermined positions are covered in parallel. Thus, also with a plurality of power semiconductors, a rational and cost effective fitting is ensured by means of moulded bodies.

The fitting of the moulded bodies 4; 5 takes place in bonding with the carrying foil 1, for example, by means of an upper tool carrying the foil by means of, for example, vacuum. A camera-controlled X-Y relative movement of semiconductor carrier and upper tool ensures a high positioning accuracy of carrying foil and power semiconductor arrangement or wafer composite. A placing over the Z-axis ensures the fitting of the carrying foil and all moulded bodies on the predetermined upper side contact faces of the semiconductor(s) (FIG. 4). A position achieved by adjustment can be fixed by, for example, gluing a few points of the carrying foil to the chip surface. Alternatively, moulded bodies can ensure bonding by engaging the sintering layer.

In FIG. 4 the material bonding of semiconductor contact face and moulded bodies occurring after the contact of the moulded bodies with the bonding layer can be seen through the bonding layer 7. Alternatively, the bonding layer can be a soft solder (Sn-, Pb-, Au-basis solder) for flow soldering or diffusion soldering of the partners. The bonding layer can, however, also be a mainly Ag-containing layer for low-temperature sintering of the partners.

If the power semiconductors are, for example, diodes, a single diode typically carries only one moulded body that is placed by the positioning exactly within the borders of the contact faces of the power semiconductor.

If the power semiconductors are transistors, the upper side of the semiconductor has at least the contact faces for the gates and emitters, in special cases additionally also the contact faces of the collector (gallium-nitride semiconductor), each being contacted by at least one moulded unit.

The carrying foil is high-temperature resistant and resists the process temperatures of soldering or sintering, so that it can be removed after the material bonding of the moulded bodies with the contact faces and merely leaves the moulded bodies at the predetermined positions (FIG. 5).

The carrying foil has a temporary fixing power that supports the moulded bodies for a limited period, at least until after positioning on the contact faces of the semiconductor(s).

If required, the fixing power of the carrying foil can be reduced, for example by ultraviolet radiation, so that the separation process can take place without leaving residual material. In an alternative embodiment, the carrying foil has already opened areas ("windows") in the area of the moulded bodies. These windows make it easier to meet the requirement for undamaged surfaces: In this way, no adhesive residues can remain in the area of the windows, and in the area of the windows a possibly required cleaning (liquid or plasma cleaning) can be made directly on the moulded unit. Eventually, these areas can be contacted by bonding techniques. A comparably efficient method of avoiding adhesive residues is the partial release of adhesive on the carrying foil over the area of the bonding face of the moulded unit.

A preferred embodiment is optimised to the copper thick wire bonding (for example up to 600 μm diameter). The current flow in the thick copper contact wires then occurs from the surface of each individual moulded body to the corresponding potential of the substrate surface.

BRIEF DESCRIPTION OF THE DRAWINGS

Further advantages and features of the invention occur from the following description of a preferred embodiment by means of the enclosed figures, showing:

FIG. 1 a view of a carrying foil 1 with a fixing layer 2 on a metal foil 3,

FIG. 2 a structuring of the metal foil into individual moulded bodies 4; 5,

FIG. 3 the elements of FIG. 2 to be connected on a wafer assembly 6, on which bonding layers 7 of sintering metal on metallisation layers 8 have been applied, FIG. 4 the sintering step with pressure and, if required, heat, FIG. 5 the step of removing the carrying foil 1 and the fixing layer 2, FIG. 6 a rough sketch of the sawing process of the semiconductor components with moulded bodies fixed thereon by sintering, FIG. 7 a chip 12 with moulded body 4, and FIG. 8 the chip of FIG. 7 with an additional oxidation inhibiting layer 10.

DETAILED DESCRIPTION

The advantages obtained by the method for creating a connection of a power semiconductor chip with upper side potential faces to thick wires or strips particularly include that neither during bonding nor by preceding or subsequent steps there is a risk of damaging the thin metallisation layers or structures of the semiconductor, and an improved current distribution is achieved. With copper thick wire bonding (for example up to 600 μm diameter of the wires), the current now runs from central fixing areas of the wires on the moulded bodies in a distributed manner through a moulded body to the corresponding potential faces of the substrate surface.

In this connection, it is suggested that to perform the method described schematically in FIGS. 1 to 8 for connecting a power semiconductor chip 12 with upper side potential faces with thick wires by means of the following steps: Providing a metallic moulded body 4; 5 corresponding to the shape of the upper side potential faces, applying a bonding layer 7 on the upper side potential faces or on the metallic moulded bodies 4; 5, and creating a cohesive, electrically conductive connection with the potential faces before a thick wire bonding on the non-bonded upper side of the moulded body 4;5.

Not shown, but being the scope of a preferred variant is that an additional moulded body in the shape of the chip is provided on the bottom side of the power semiconductor chip 12 and is connected cohesively to the bottom side of the power semiconductor chip 12 opposite to the upper side potential faces by means of a bonding layer.

Materials for the moulded bodies 4; 5 are, for example, metals of the group Cu, Ag, Au, Mo, Al, W or their alloys, the alloys comprising one or more metals of the group mentioned.

For the bonding layer for fixing the moulded bodies 4; 5 on the upper side potential faces, low-temperature sintering technology, diffusion soldering or gluing to the power semiconductor chip 12 is provided, and it is further suggested that that the moulded bodies 4; 5 provided with a sintering layer for joining are covered with silver or nickel-gold before applying the sintering material. The alternative is that the sintering material is applied on metallisation layers 8, for example, the upper side potential faces of, for example, a wafer assembly 6 (FIG. 3).

As material, on which the moulded body 4; 5 is provided, a flexible organic carrying foil 1, for example of polyimide or polyamide, is suggested. A plurality of other materials, for example NOMEX foil, can be imagined to form an electrically isolating carrying sheet that can resist the thermal load of bonding, also for large areas, for example a wafer assembly 6 of carrying foil.

The carrying sheet, provided with a number of moulded bodies 4; 5 corresponding to the number of potential faces, can then be placed on one or more, particularly not yet divided, power semiconductor chips 12 of a wafer assembly 6 before joining. An adhesive layer 2 keeps the moulded bodies 4; 5 on the carrying sheet. After bonding, the carrying sheet can be pulled off from the moulded bodies 4; 5, so that it does not prevent the thick wire bonding. An alternative embodiment, in which the carrying sheets have punched holes for the thick wire bonding, is also possible. Here, the carrying sheet would remain, at least as an edge that could, if required, have some sort of protective function.

In an alternative embodiment, the detachable carrying foil has areas, on which no adhesive of a fixing layer 2 has been provided on partial faces, or even punched or otherwise opened areas ("windows") created in the foil in the area of, for example, the centre of the upper side of the moulded unit.

These windows, which are preferable provided above the central partial faces of the moulded bodies, which are prepared for bonding, make it easier to fulfil the requirement for undamaged surfaces, particularly surface areas without adhesive residues, for the subsequent thick wire bonding.

Thus, the method according to the invention provides several advantages:

The moulded bodies enables an upper side connection by means of thick copper wires and copper strips, also with thin semiconductor elements.

The moulded bodies protect the sensitive thin metallised surfaces of the semiconductors (typically only around 3-4 μm) during the thick copper wire bonding.

The moulded bodies ensure an improved current density distribution over the complete cross-section of the chip surface.

The moulded bodies protect the sensitive surface structure of the semiconductor during frictional contacting by means of sprung contacts. This simplifies the non-destructive, electrical quality testing in the production lines.

By means of a symmetrisation of the mechanical stresses, a bottom side layer prevents the dishing effect (deformation of the semiconductor element).

Upper and lower side carrying foils form conducting face areas, which can cover a complete wafer, thus permitting, in a cost efficient and exact manner, the parallel contacting of all contact faces.

Although various embodiments of the present invention have been described and shown, the invention is not restricted thereto, but may also be embodied in other ways within the scope of the subject-matter defined in the following claims.

What is claimed is:

1. A method for creating a connection of a power semiconductor chip having upper side potential faces with thick wires or strips, comprising:
   providing a carrying sheet with a plurality of metallic moulded bodies corresponding to the shape of the upper side potential faces, wherein the carrying sheet has a plurality of windows provided above central partial faces of the plurality of metallic moulded bodies,
   applying a bonding layer on the upper side potential faces or the plurality of metallic moulded bodies,
   placing the plurality of metallic moulded bodies and creating a cohesive, electrically conducting connection to the upper side potential faces, and
   removing the carrying sheet after bonding the plurality of metallic moulded bodies to the upper side potential faces.

2. The method for creating a connection of a power semiconductor chip according to claim 1, wherein the moulded bodies provided comprise at least one metal of the group of Cu, Ag, Au, Mo, Al, W or their alloys, the alloys comprising one or more of the metals of the group mentioned.

3. The method for creating a connection of a power semiconductor chip according to claim 1, wherein by means of the bonding layer, moulded bodies and potential faces are bonded by means of sintering, diffusion soldering or gluing to the power semiconductor chip.

4. The method for creating a connection of a power semiconductor chip according to claim 1, wherein the carrying sheet is an organic carrying sheet.

5. The method for creating a connection of a power semiconductor chip according to claim 1, wherein an additional moulded body having the shape of a bottom side of the power semiconductor chip is provided to be cohesively connected with a bonding layer on the bottom side of the power semiconductor chip lying opposite to the upper side potential faces.

6. The method for creating a connection of a power semiconductor chip according to claim 1, wherein an electrically insulating material that can resist the thermal load of the bonding is used for the carrying sheet.

7. The method for creating a connection of a power semiconductor chip according to claim 1, wherein the carrying sheet with a number of moulded bodies corresponding to the number of potential faces is applied on two or more unseparated power semiconductor chips before bonding.

8. The method for creating a connection of a power semiconductor chip according to claim 1, wherein the carrying sheet is removed while the power semiconductor chip is unseparated.

9. The method for creating a connection of a power semiconductor chip according to claim 1, wherein above the central partial faces of the moulded bodies meant for bonding, the carrying sheet is not provided with adhesive.

10. The method for creating a connection of a power semiconductor chip according to claim 2, wherein by means of the bonding layer, moulded bodies and potential faces are bonded by means of sintering, diffusion soldering or gluing to the power semiconductor chip.

11. The method for creating a connection of a power semiconductor chip according to claim 2, wherein the carrying sheet is an organic carrying sheet.

12. The method for creating a connection of a power semiconductor chip according to claim 3, wherein the carrying sheet is an organic carrying sheet.

13. The method for creating a connection of a power semiconductor chip according to claim 2, wherein an additional moulded body having the shape of a bottom side of the power semiconductor chip is provided to be cohesively connected with a bonding layer on the bottom side of the power semiconductor chip lying opposite to the upper side potential faces.

14. The method for creating a connection of a power semiconductor chip according to claim 3, wherein an additional moulded body having the shape of a bottom side of the power semiconductor chip is provided to be cohesively connected with a bonding layer on the bottom side of the power semiconductor chip lying opposite to the upper side potential faces.

15. The method for creating a connection of a power semiconductor chip according to claim 4, wherein an additional moulded body having the shape of a bottom side of the power semiconductor chip is provided to be cohesively connected with a bonding layer on the bottom side of the power semiconductor chip lying opposite to the upper side potential faces.

16. The method for creating a connection of a power semiconductor chip according to claim 2, wherein an electrically insulating material that can resist the thermal load of the bonding is used for the carrying sheet.

17. The method for creating a connection of a power semiconductor chip according to claim 3, wherein an electrically insulating material that can resist the thermal load of the bonding is used for the carrying sheet.

18. The method for creating a connection of a power semiconductor chip according to claim 4, wherein an electrically insulating material that can resist the thermal load of the bonding is used for the carrying sheet.

19. The method for creating a connection of a power semiconductor chip according to claim 5, wherein an electrically insulating material that can resist the thermal load of the bonding is used for the carrying sheet.

20. The method for creating a connection of a power semiconductor chip according to claim 2, wherein the carrying sheet with a number of moulded bodies corresponding to the number of potential faces is applied on two or more unseparated power semiconductor chips before bonding.

21. A method for creating a connection of a power semiconductor chip having upper side potential faces with thick wires or strips, comprising:
   providing a carrying sheet with a plurality of metallic moulded bodies corresponding to the shape of the upper side potential faces, wherein the carrying sheet does not have adhesive above central partial faces of the plurality of metallic moulded bodies meant for bonding,
   applying a bonding layer on the upper side potential faces or the plurality of metallic moulded bodies,
   placing the metallic moulded bodies and creating a cohesive, electrically conducting connection to the potential faces, wherein there is no thick-wire bonded on non-bonded upper sides of the plurality of metallic moulded bodies; and
   removing the carrying sheet after bonding the plurality of metallic moulded bodies to the upper side potential faces.

22. The method for creating a connection of a power semiconductor chip according to claim 1, further comprising the step of: thick-wire bonding on non-bonded upper sides of the plurality of metallic moulded bodies.

* * * * *